US012648393B2

(12) United States Patent
Fukusumi et al.

(10) Patent No.: US 12,648,393 B2
(45) Date of Patent: Jun. 2, 2026

(54) TEMPERATURE REGULATING APPARATUS FOR SEMICONDUCTOR-DEVICE MANUFACTURING EQUIPMENT, AND SEMICONDUCTOR-DEVICE MANUFACTURING SYSTEM

(71) Applicants:EBARA CORPORATION, Tokyo (JP); CKD CORPORATION, Aichi (JP)

(72) Inventors: Yukihiro Fukusumi, Tokyo (JP); Shinichi Nitta, Aichi (JP); Norio Kokubo, Aichi (JP)

(73) Assignees: EBARA REFRIGERATION EQUIPMENT & SYSTEMS CO., LTD., Tokyo (JP); CKD CORPORATION, Aichi (JP)

( * ) Notice: Subject to any disclaimer, the term of this patent is extended or adjusted under 35 U.S.C. 154(b) by 656 days.

(21) Appl. No.: 18/189,639

(22) Filed: Mar. 24, 2023

(65) Prior Publication Data

US 2023/0317482 A1     Oct. 5, 2023

(30) Foreign Application Priority Data

Mar. 31, 2022     (JP) ................................. 2022-058188

(51) Int. Cl.
*H10P 72/00*          (2026.01)
*G05D 23/19*         (2006.01)

(52) U.S. Cl.
CPC ......... *H10P 72/0602* (2026.01); *G05D 23/19* (2013.01)

(58) Field of Classification Search
None
See application file for complete search history.

(56) References Cited

U.S. PATENT DOCUMENTS 5,802,856 A * 9/1998 Schaper .................... B01L 7/52
                                                          118/724
6,447,369 B1 * 9/2002 Moore .................... B24B 49/04
                                                          451/6
(Continued)

FOREIGN PATENT DOCUMENTS

JP          H0729967 A  *  1/1995  .............. H01J 37/34
JP          2002141287 A  *  5/2002
(Continued)

OTHER PUBLICATIONS

Machine Generated English Translation of BIB of JP2005197471. Held to Kotani, Koji et al. Published Jul. 21, 2005 (Year: 2005).*
(Continued)

*Primary Examiner* — Sylvia Macarthur
(74) *Attorney, Agent, or Firm* — Leydig, Voit & Mayer, Ltd.

(57)          ABSTRACT

A temperature regulating apparatus includes: a heating section configured to produce a heating liquid; a cooling section configured to produce a cooling liquid; a heating-liquid delivery pipe for delivering the heating liquid to the semiconductor-device manufacturing equipment; a cooling-liquid delivery pipe for delivering the cooling liquid to the semiconductor-device manufacturing equipment; a heating-side return pipe for returning a liquid mixture of the heating liquid and the cooling liquid that have passed through the semiconductor-device manufacturing equipment to the heating section; a cooling-side return pipe for returning the liquid mixture that has passed through the semiconductor-device manufacturing equipment to the cooling section; and at least one of a heating-side heat exchanger configured to exchange heat between the heating liquid and the liquid mixture and a cooling-side heat exchanger configured to
(Continued)

exchange heat between the cooling liquid and the liquid mixture.

17 Claims, 8 Drawing Sheets

(56)                    References Cited

U.S. PATENT DOCUMENTS

| | | | | |
|---|---|---|---|---|
| 6,514,073 | B1 * | 2/2003 | Toshima | G03F 7/168 |
| | | | | 118/724 |
| 6,913,514 | B2 * | 7/2005 | Kimura | B24B 37/205 |
| | | | | 451/6 |
| 7,000,416 | B2 * | 2/2006 | Hirooka | H01J 37/32724 |
| | | | | 165/104.19 |
| 7,988,062 | B2 * | 8/2011 | Nonaka | G05D 23/1934 |
| | | | | 236/1 C |
| 9,664,460 | B2 * | 5/2017 | Tabuchi | G05D 23/1858 |
| 9,852,888 | B2 * | 12/2017 | Goto | H01J 37/32009 |
| 9,984,908 | B2 * | 5/2018 | Kobayashi | G05D 23/1934 |
| 10,562,147 | B2 * | 2/2020 | Butterfield | B24B 49/12 |
| 10,903,057 | B2 * | 1/2021 | Wakai | H01J 37/3244 |
| 11,164,759 | B2 * | 11/2021 | Koltonski | H01L 21/67069 |
| 2003/0148706 | A1 * | 8/2003 | Birang | B24B 37/013 |
| | | | | 451/6 |
| 2007/0272155 | A1 * | 11/2007 | Nozawa | H01L 21/67109 |
| | | | | 118/724 |
| 2008/0314564 | A1 * | 12/2008 | Nagaseki | G05D 23/19 |
| | | | | 165/104.31 |
| 2010/0116484 | A1 * | 5/2010 | Kokubo | F25D 17/02 |
| | | | | 165/61 |
| 2011/0165325 | A1 * | 7/2011 | Paulman | H10F 71/125 |
| | | | | 118/724 |
| 2013/0240144 | A1 * | 9/2013 | Buchberger | G05D 23/1393 |
| | | | | 165/100 |
| 2015/0060013 | A1 * | 3/2015 | Buchberger, Jr. | H01L 21/6831 |
| | | | | 156/345.29 |
| 2015/0226611 | A1 * | 8/2015 | Busche | H01L 21/6833 |
| | | | | 374/121 |
| 2016/0155612 | A1 * | 6/2016 | Mahadeswaraswamy | |
| | | | | G05B 6/02 |
| | | | | 700/282 |
| 2021/0148621 | A1 * | 5/2021 | Ito | F25B 49/022 |
| 2021/0148630 | A1 * | 5/2021 | Ito | G05D 23/1333 |
| 2022/0187027 | A1 * | 6/2022 | Ito | F25B 1/00 |
| 2023/0317482 | A1 * | 10/2023 | Fukusumi | G05D 23/1313 |
| | | | | 165/61 |

FOREIGN PATENT DOCUMENTS

| | | | | | |
|---|---|---|---|---|---|
| JP | 2005197471 | A | * | 7/2005 | |
| JP | 2010117812 | A | * | 5/2010 | F24H 9/20 |
| JP | 2021081144 | A | | 5/2021 | |
| WO | WO-2004079805 | A1 | * | 9/2004 | C23C 16/463 |

OTHER PUBLICATIONS

Machine Generated English Translation of CLM of JP2005197471. Held to Kotani, Koji et al. Published Jul. 21, 2005 (Year: 2005).*
Machine Generated English Translation of DESC of JP2005197471. Held to Kotani, Koji et al. Published Jul. 21, 2005 (Year: 2005).*

* cited by examiner

Prior Art

TEMPERATURE REGULATING APPARATUS FOR SEMICONDUCTOR-DEVICE MANUFACTURING EQUIPMENT, AND SEMICONDUCTOR-DEVICE MANUFACTURING SYSTEM

CROSS REFERENCE TO RELATED APPLICATION

This document claims priority to Japanese Patent Application No. 2022-058188 filed Mar. 31, 2022, the entire contents of which are hereby incorporated by reference.

BACKGROUND

Semiconductor-device manufacturing equipment (e.g., etching equipment, CVD equipment) for manufacturing semiconductor devices is configured to perform manufacturing processes while controlling a processing temperature. For example, in etching equipment, a processing temperature for a wafer is regulated by a temperature-regulated liquid flowing through a flow passage formed in a susceptor that supports the wafer.

FIG. 8 is a schematic diagram showing an example of a conventional temperature regulating apparatus for semiconductor-device manufacturing equipment. The temperature regulating apparatus includes a heating section 501 that produces a heating liquid, and a cooling section 502 that produces a cooling liquid. The heating liquid and the cooling liquid are mixed to form a liquid mixture, and the liquid mixture is delivered to a susceptor 507 of semiconductor-device manufacturing equipment 505. A wafer W to be processed is supported on the susceptor 507. Heat exchange occurs between the susceptor 507 and the liquid mixture, so that the semiconductor-device manufacturing equipment 505 is maintained at a target temperature.

A temperature of the liquid mixture to be delivered to the semiconductor-device manufacturing equipment 505 is determined by a flow rate of the heating liquid and a flow rate of the cooling liquid (i.e., a mixing ratio of the heating liquid and the cooling liquid). Therefore, the flow rate of the heating liquid and the flow rate of the cooling liquid are regulated by a heating-side flow-rate regulating valve 511 and a cooling-side flow-rate regulating valve 512 so that the semiconductor-device manufacturing equipment 505 is maintained at the target temperature. The liquid mixture that has passed through the semiconductor-device manufacturing equipment 505 is distributed to the heating section 501 and the cooling section 502. A part of the liquid mixture is heated again in the heating section 501 to become the heating liquid, and the other part of the liquid mixture is cooled again in the cooling section 502 to become the cooling liquid.

Recently, there has been a demand for changing the target temperature of the semiconductor-device manufacturing equipment 505 during processing of the wafer. In particular, an intermediate temperature between the temperature of the heating liquid and the temperature of the cooling liquid may be used in the processing of the wafer. However, when a liquid mixture having the intermediate temperature is heated and cooled again by the heating section 501 and the cooling section 502, significant thermal power is required for the heating section 501 and the cooling section 502.

SUMMARY

Therefore, there is provided a temperature regulating apparatus capable of reducing thermal power of a heating section and a cooling section required for semiconductor-device manufacturing equipment to have a target temperature. The present invention also provides a semiconductor-device manufacturing system including such a temperature regulating apparatus and semiconductor-device manufacturing equipment.

Embodiments, which will be described below, relate to a temperature regulating apparatus for regulating a temperature of semiconductor-device manufacturing equipment, such as etching equipment or CVD equipment, for manufacturing semiconductor devices. Further, embodiments, which will be described below, relate to a semiconductor-device manufacturing system including such a temperature regulating apparatus and semiconductor-device manufacturing equipment.

In an embodiment, there is provided a temperature regulating apparatus for regulating a temperature of semiconductor-device manufacturing equipment, comprising: a heating section configured to produce a heating liquid; a cooling section configured to produce a cooling liquid; a heating-liquid delivery pipe coupled to the heating section, the heating-liquid delivery pipe being configured to deliver the heating liquid to the semiconductor-device manufacturing equipment; a cooling-liquid delivery pipe coupled to the cooling section, the cooling-liquid delivery pipe being configured to deliver the cooling liquid to the semiconductor-device manufacturing equipment; a heating-side return pipe coupled to the heating section, the heating-side return pipe being configured to return a liquid mixture of the heating liquid and the cooling liquid that have passed through the semiconductor-device manufacturing equipment to the heating section; a cooling-side return pipe coupled to the cooling section, the cooling-side return pipe being configured to return the liquid mixture that has passed through the semiconductor-device manufacturing equipment to the cooling section; and at least one of a heating-side heat exchanger configured to exchange heat between the heating liquid and the liquid mixture returning to the heating section and a cooling-side heat exchanger configured to exchange heat between the cooling liquid and the liquid mixture returning to the cooling section.

In an embodiment, the temperature regulating apparatus further comprises: a heating-side flow-rate regulating valve attached to the heating-liquid delivery pipe; and a heating-side branch pipe extending from the heating-side flow-rate regulating valve to the heating-side return pipe.

In an embodiment, the temperature regulating apparatus further comprises: a cooling-side flow-rate regulating valve attached to the cooling-liquid delivery pipe; and a cooling-side branch pipe extending from the cooling-side flow-rate regulating valve to the cooling-side return pipe.

In an embodiment, the temperature regulating apparatus comprises the heating-side heat exchanger, the heating-side heat exchanger is coupled to the heating-liquid delivery pipe and the heating-side return pipe, and the temperature regulating apparatus further comprises: a heating-side bypass pipe coupled to the heating-liquid delivery pipe and configured to bypass the heating-side heat exchanger; a heating-side bypass valve configured to regulate a flow rate of the heating liquid delivered to the heating-side bypass pipe and a flow rate of the heating liquid delivered to the heating-side heat exchanger; and a valve controller configured to operate the heating-side bypass valve based on a temperature index of the liquid mixture.

In an embodiment, the temperature index comprises a temperature of the liquid mixture that has passed through the semiconductor-device manufacturing equipment.

In an embodiment, the temperature index comprises a target temperature set in the semiconductor-device manufacturing equipment.

In an embodiment, the valve controller is configured to instruct the heating-side bypass valve to provide a fluid communication between the heating section and the heating-side bypass pipe when the temperature index is above a heating-side threshold value.

In an embodiment, the temperature regulating apparatus comprises the cooling-side heat exchanger, the cooling-side heat exchanger is coupled to the cooling-liquid delivery pipe and the cooling-side return pipe, and the temperature regulating apparatus further comprises: a cooling-side bypass pipe coupled to the cooling-liquid delivery pipe and configured to bypass the cooling-side heat exchanger; a cooling-side bypass valve configured to regulate a flow rate of the cooling liquid delivered to the cooling-side bypass pipe and a flow rate of the cooling liquid delivered to the cooling-side heat exchanger; and a valve controller configured to operate the cooling-side bypass valve based on a temperature index of the liquid mixture.

In an embodiment, the temperature index comprises a temperature of the liquid mixture that has passed through the semiconductor-device manufacturing equipment.

In an embodiment, the temperature index comprises a target temperature set in the semiconductor-device manufacturing equipment.

In an embodiment, the valve controller is configured to instruct the cooling-side bypass valve to provide a fluid communication between the cooling section and the cooling-side bypass pipe when the temperature index is below a cooling-side threshold value.

In an embodiment, the temperature regulating apparatus comprises both the heating-side heat exchanger and the cooling-side heat exchanger.

In an embodiment, the temperature regulating apparatus further comprises a liquid junction coupled to the heating-liquid delivery pipe and the cooling-liquid delivery pipe and configured to mix the heating liquid and the cooling liquid to produce the liquid mixture.

In an embodiment, the temperature regulating apparatus further comprises a distribution valve configured to distribute the liquid mixture that has passed through the semiconductor-device manufacturing equipment to the heating-side return pipe and the cooling-side return pipe.

In an embodiment, there is provided a semiconductor-device manufacturing system comprising: semiconductor-device manufacturing equipment for manufacturing semiconductor devices; and the above-mentioned temperature regulating apparatus for regulating a temperature of the semiconductor-device manufacturing equipment.

The heating-side heat exchanger increases a temperature of the liquid mixture returning to the heating section with the heating liquid produced by the heating section. Therefore, the heating-side heat exchanger can reduce thermal power (i.e., heating load) required for the heating section to heat the liquid mixture to a set temperature and produce the heating liquid again. Similarly, the cooling-side heat exchanger lowers a temperature of the liquid mixture returning to the cooling section with the cooling liquid produced by the cooling section. Therefore, the cooling-side heat exchanger can reduce thermal power (i.e., cooling load) required for the cooling section to cool the liquid mixture to a set temperature and produce the cooling liquid again. As a result, the heating-side heat exchanger and the cooling-side heat exchanger can improve a temperature regulating efficiency of the temperature regulating apparatus.

The heat exchange in the heating-side heat exchanger increases the temperature of the liquid mixture, while this heat exchange lowers a temperature of the heating liquid. Therefore, when the target temperature set in the semiconductor-device manufacturing equipment is near the temperature of the heating liquid, the heat exchange in the heating-side heat exchanger may rather increase the thermal power required for the heating section. According to the above-described embodiments, when the target temperature set in the semiconductor-device manufacturing equipment is near the temperature of the heating liquid, at least a part of the heating liquid bypasses the heating-side heat exchanger. Such an operation can prevent a decrease in the temperature regulating efficiency of the temperature regulating apparatus.

Similarly, the heat exchange in the cooling-side heat exchanger lowers the temperature of the liquid mixture, while this heat exchange increases a temperature of the cooling liquid. Therefore, when the target temperature set in the semiconductor-device manufacturing equipment is near the temperature of the cooling liquid, the heat exchange in the cooling-side heat exchanger may rather increase the thermal power required for the cooling section. According to the above-described embodiments, when the target temperature set in the semiconductor-device manufacturing equipment is near the temperature of the cooling liquid, at least a part of the cooling liquid bypasses the cooling-side heat exchanger. Such an operation can prevent a decrease in the temperature regulating efficiency of the temperature regulating apparatus.

DESCRIPTION OF EMBODIMENTS

Hereinafter, embodiments of the present invention will be described with reference to the drawings.

Figure 1:
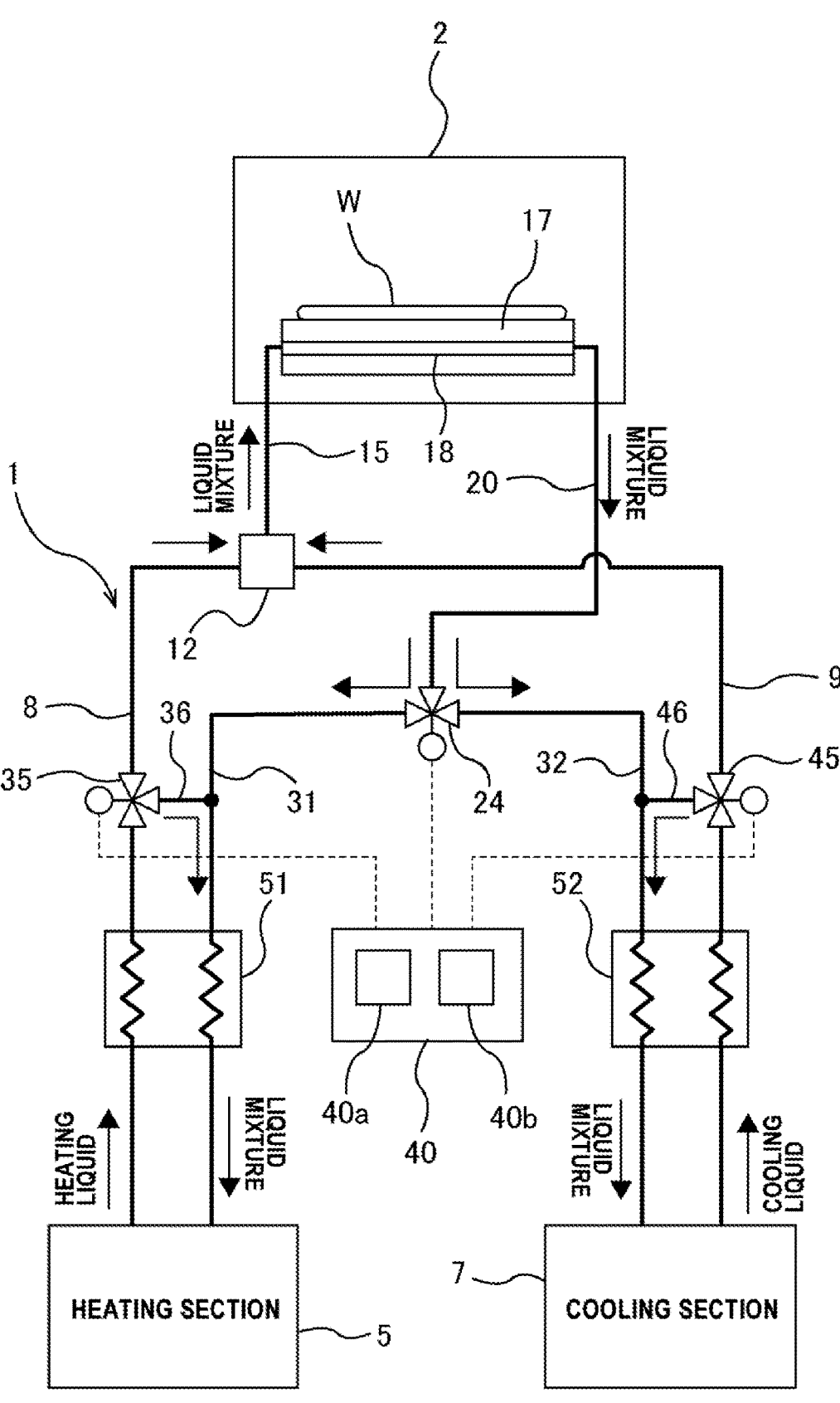
FIG. 1 is a schematic diagram showing an embodiment of a semiconductor-device manufacturing system including a temperature regulating apparatus and semiconductor-device manufacturing equipment.

FIG. 1 is a schematic diagram showing an embodiment of a semiconductor-device manufacturing system including a temperature regulating apparatus 1 and semiconductor-device manufacturing equipment 2. The temperature regulating apparatus 1 is used to regulate a temperature of the semiconductor-device manufacturing equipment 2 (e.g., etching equipment, CVD equipment, PVD equipment, etc.). As shown in FIG. 1, the semiconductor-device manufacturing system includes the temperature regulating apparatus 1, and the semiconductor-device manufacturing equipment 2 coupled to the temperature regulating apparatus 1. In the embodiment shown in FIG. 1, the semiconductor-device manufacturing equipment 2 is etching equipment configured to perform plasma-etching process on a wafer W, while the semiconductor-device manufacturing equipment 2 is not limited to this embodiment.

The temperature regulating apparatus 1 includes a heating section 5 configured to produce a heating liquid, and a cooling section 7 configured to produce a cooling liquid. The heating liquid and the cooling liquid is the same type of liquid, such as a fluorine-based inert liquid. An electric heater or the like can be used for the heating section 5. The cooling section 7 may be a vapor compression refrigeration machine, an absorption refrigeration machine, or the like. Types of the vapor compression refrigeration machine include turbo refrigeration machine, screw refrigeration machine, rotary refrigeration machine, scroll refrigeration machine, etc., and these can be used. Configurations of the heating section 5 and the cooling section 7 are not limited as long as liquid can be heated and cooled.

The temperature regulating apparatus 1 further includes a heating-liquid delivery pipe 8 for delivering the heating liquid produced by the heating section 5 to the semiconductor-device manufacturing equipment 2, and a cooling-liquid delivery pipe 9 for delivering the cooling liquid produced by the cooling section 7 to the semiconductor-device manufacturing equipment 2. One end of the heating-liquid delivery pipe 8 is coupled to the heating section 5, and one end of the cooling-liquid delivery pipe 9 is coupled to the cooling section 7. The other end of the heating-liquid delivery pipe 8 and the other end of the cooling-liquid delivery pipe 9 are coupled to a liquid junction 12. The heating liquid produced by the heating section 5 and the cooling liquid produced by the cooling section 7 flow through the heating-liquid delivery pipe 8 and the cooling-liquid delivery pipe 9, respectively, and are mixed at the liquid junction 12 to form a liquid mixture.

The liquid junction 12 is coupled to a susceptor 17 of the semiconductor-device manufacturing equipment 2 via an inflow pipe 15. The susceptor 17 has a flow passage 18 therein. One end of the inflow pipe 15 is coupled to the liquid junction 12, and the other end of the inflow pipe 15 is coupled to an inlet of the flow passage 18. The wafer W to be processed is supported on the susceptor 17. The liquid mixture, which is a mixture of the heating liquid and the cooling liquid, is delivered through the inflow pipe 15 to the flow passage 18 of the susceptor 17.

An outflow pipe 20 is coupled to an outlet of the flow passage 18 of the susceptor 17. One end of the outflow pipe 20 is coupled to the outlet of the susceptor 17, and the other end of the outflow pipe 20 is coupled to a distribution valve 24. The temperature regulating apparatus 1 includes a heating-side return pipe 31 for returning the liquid mixture that has passed through the semiconductor-device manufacturing equipment 2 to the heating section 5, and a cooling-side return pipe 32 for returning the liquid mixture that has passed through the semiconductor-device manufacturing equipment 2 to the cooling section 7. One end of the heating-side return pipe 31 is coupled to the distribution valve 24, and the other end of the heating-side return pipe 31 is coupled to the heating section 5. One end of the cooling-side return pipe 32 is coupled to the distribution valve 24, and the other end of the cooling-side return pipe 32 is coupled to the cooling section 7.

The liquid mixture that has passed through the semiconductor-device manufacturing equipment 2 flows through the outflow pipe 20 and is distributed into the heating-side return pipe 31 and the cooling-side return pipe 32 by the distribution valve 24. Specifically, a part of the liquid mixture is returned to the heating section 5 through the heating-side return pipe 31, and the other part of the liquid mixture is returned to the cooling section 7 through the cooling-side return pipe 32. In this way, the heating liquid and the cooling liquid circulate between the temperature regulating apparatus 1 and the semiconductor-device manufacturing equipment 2.

The heating section 5 is configured to heat the liquid mixture that has been returned through the heating-side return pipe 31 to a preset temperature (e.g., 60° C.) to thereby produce the heating liquid, and is configured to deliver the heating liquid into the heating-liquid delivery pipe 8 at a preset constant flow rate. Similarly, the cooling section 7 is configured to cool the liquid mixture that has been returned through the cooling-side return pipe 32 to a preset temperature (e.g., −40° C.) to thereby produce the cooling liquid, and is configured to deliver the cooling liquid into the cooling-liquid delivery pipe 9 at a preset constant flow rate.

The temperature regulating apparatus 1 further includes a heating-side flow-rate regulating valve 35 configured to regulate a flow rate of the heating liquid to be delivered through the heating-liquid delivery pipe 8 to the liquid junction 12. The heating-side flow-rate regulating valve 35 is attached to the heating-liquid delivery pipe 8. The heating-side flow-rate regulating valve 35 may be, for example, a three-way valve having a flow-rate regulating function. The heating-side flow-rate regulating valve 35 is coupled to the heating-side return pipe 31 through a heating-side branch pipe 36. Specifically, one end of the heating-side branch pipe 36 is coupled to the heating-side flow-rate regulating valve 35, and the other end of the heating-side branch pipe 36 is coupled to the heating-side return pipe 31. The heating-side flow-rate regulating valve 35 is electrically connected to a valve controller 40, and operations of the heating-side flow-rate regulating valve 35 are controlled by the valve controller 40.

The temperature regulating apparatus 1 further includes a cooling-side flow-rate regulating valve 45 configured to regulate a flow rate of the cooling liquid to be delivered through the cooling-liquid delivery pipe 9 to the liquid junction 12. The cooling-side flow-rate regulating valve 45 is attached to the cooling-liquid delivery pipe 9. The cooling-side flow-rate regulating valve 45 may be, for example, a three-way valve having a flow-rate regulating function. The cooling-side flow-rate regulating valve 45 is coupled to the cooling-side return pipe 32 through a cooling-side branch pipe 46. Specifically, one end of the cooling-side branch pipe 46 is coupled to the cooling-side flow-rate regulating valve 45, and the other end of the cooling-side branch pipe 46 is coupled to the cooling-side return pipe 32. The cooling-side flow-rate regulating valve 45 is electrically connected to the valve controller 40, and operations of the cooling-side flow-rate regulating valve 45 are controlled by the valve controller 40.

A temperature of the liquid mixture to be delivered to the semiconductor-device manufacturing equipment 2 is determined by the flow rate of the heating liquid and the flow rate of the cooling liquid (i.e., a mixing ratio of the heating liquid and the cooling liquid). Therefore, the valve controller 40 determines the flow rate of the heating liquid and the flow rate of the cooling liquid based on a target temperature of the semiconductor-device manufacturing equipment 2. The valve controller 40 transmits instruction signals indicating the determined flow rates to the heating-side flow-rate regulating valve 35 and the cooling-side flow-rate regulating valve 45, respectively, to cause the heating-side flow-rate regulating valve 35 and the cooling-side flow-rate regulating valve 45 to regulate the flow rate of the heating liquid and the flow rate of the cooling liquid. Such control of the flow rate of the heating liquid and the flow rate of the cooling liquid maintains the semiconductor-device manufacturing equipment 2 at the target temperature. In one embodiment, when a variable-flow type pump is used in each of the heating section 5 and the cooling section 7, the heating-side flow-rate regulating valve 35 and the cooling-side flow-rate regulating valve 45 may not be provided.

The heating liquid flows from the heating-side flow-rate regulating valve 35 through the heating-side branch pipe 36 to the heating-side return pipe 31 at a flow rate corresponding to a difference between the flow rate of the heating liquid delivered from the heating section 5 to the heating-side flow-rate regulating valve 35 and the flow rate of the heating liquid regulated by the heating-side flow-rate regulating valve 35, and is returned to the heating section 5 through the heating-side return pipe 31. Similarly, the cooling liquid flows from the cooling-side flow-rate regulating valve 45 through the cooling-side branch pipe 46 to the cooling-side return pipe 32 at a flow rate corresponding to a difference between the flow rate of the cooling liquid delivered from the cooling section 7 to the cooling-side flow-rate regulating valve 45 and the flow rate of the cooling liquid regulated by the cooling-side flow-rate regulating valve 45, and is returned to the cooling section 7 through the cooling-side return pipe 32.

The valve controller 40 includes a memory 40a storing programs therein, and an arithmetic device 40b configured to perform arithmetic operations according to instructions contained in the programs. The valve controller 40 is composed of at least one computer (e.g., microcomputer, programmable logic controller). The memory 40a includes a main memory, such as a random-access memory (RAM), and an auxiliary memory, such as a hard disk drive (HDD) or a solid state drive (SSD). Examples of the arithmetic device 40b include a CPU (central processing unit) and a GPU (graphics processing unit). However, the specific configurations of the valve controller 40 are not limited to these examples.

The heating liquid and the cooling liquid flow into the liquid junction 12 at flow rates regulated by the heating-side flow-rate regulating valve 35 and the cooling-side flow-rate regulating valve 45, respectively, to form the liquid mixture. The liquid mixture is delivered to the susceptor 17 of the semiconductor-device manufacturing equipment 2. The liquid mixture that has passed through the semiconductor-device manufacturing equipment 2 is distributed to the heating section 5 and the cooling section 7. The liquid mixture is heated again by the heating section 5 to become the heating liquid, and is cooled again by the cooling section 7 to become the cooling liquid.

The liquid mixture that has passed through the semiconductor-device manufacturing equipment 2 is distributed to the heating-side return pipe 31 and the cooling-side return pipe 32 by the distribution valve 24 at the same flow rates as those of the heating liquid and the cooling liquid that has flowed into the liquid junction 12. Operations of the distribution valve 24 are controlled by the valve controller 40. Specifically, the valve controller 40 transmits to the distribution valve 24 an instruction signal which indicates the same flow rates as the flow rate of the heating liquid and the flow rate of the cooling liquid determined based on the target temperature of the semiconductor-device manufacturing equipment 2. The distribution valve 24 distributes the liquid mixture to the heating-side return pipe 31 and the cooling-side return pipe 32 at the flow rates based on the instruction signal.

The temperature regulating apparatus 1 includes a heating-side heat exchanger 51 configured to exchange heat between the heating liquid produced by the heating section 5 and the liquid mixture returning to the heating section 5, and a cooling-side heat exchanger 52 configured to exchange heat between the cooling liquid produced by the cooling section 7 and the liquid mixture returning to the cooling section 7. The heating-side heat exchanger 51 is coupled to the heating-liquid delivery pipe 8 and the heating-side return pipe 31, and is disposed between the heating section 5 and the heating-side flow-rate regulating valve 35. The cooling-side heat exchanger 52 is coupled to the cooling-liquid delivery pipe 9 and the cooling-side return pipe 32, and is disposed between the cooling section 7 and the cooling-side flow-rate regulating valve 45.

The heating liquid flowing through the heating-liquid delivery pipe 8 and the liquid mixture flowing through the heating-side return pipe 31 exchange heat in the heating-side heat exchanger 51, so that the liquid mixture returning to the heating section 5 is heated with the heating liquid. The heating section 5 produces the heating liquid by heating the liquid mixture to a preset temperature (e.g., 60° C.). Since the liquid mixture is already heated with the heating liquid in the heating-side heat exchanger 51, the heating section 5 can produce the heating liquid with less thermal power.

Similarly, the cooling liquid flowing through the cooling-liquid delivery pipe 9 and the liquid mixture flowing through the cooling-side return pipe 32 exchange heat in the cooling-side heat exchanger 52, so that the liquid mixture returning to the cooling section 7 is cooled with the cooling liquid. The cooling section 7 produces the cooling liquid by cooling the liquid mixture to a preset temperature (e.g., −40° C.). Since the liquid mixture is already cooled with the cooling liquid in the cooling-side heat exchanger 52, the cooling section 7 can produce the cooling liquid with less thermal power.

Figure 2:
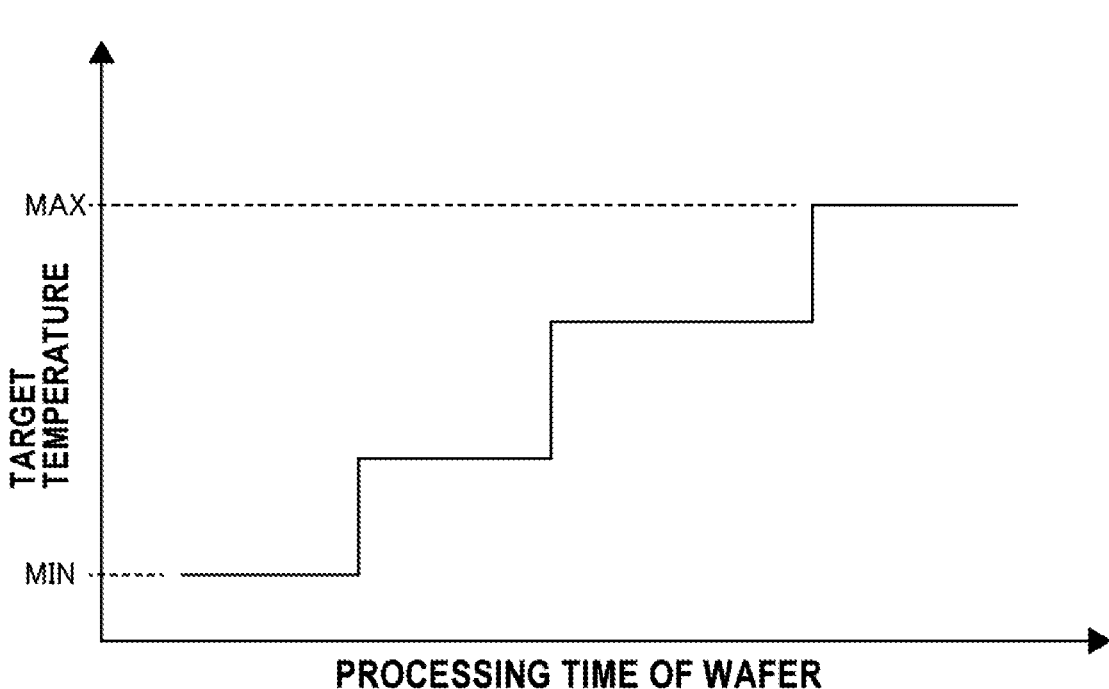
FIG. 2 is a diagram showing an example of wafer processing in which a target temperature of the semiconductor-device manufacturing equipment is changed stepwise.

The heating-side heat exchanger 51 and the cooling-side heat exchanger 52 are effective when the target temperature of the semiconductor-device manufacturing equipment 2 is near a middle temperature between the temperature of the heating liquid and the temperature of the cooling liquid. As shown in FIG. 2, there has recently been a demand for changing the target temperature of the semiconductor-device manufacturing equipment 2 stepwise during the processing of the wafer W. In FIG. 2, when the wafer W is processed at an intermediate temperature between MIN which corresponds to the temperature of the cooling liquid and MAX which corresponds to the temperature of the heating liquid, the liquid mixture having the intermediate temperature is returned to the temperature regulating apparatus 1. The heating-side heat exchanger 51 can reduce a temperature difference between the liquid mixture having the intermediate temperature returned to the heating section 5 and the heating liquid to be produced in the heating section 5. The cooling-side heat exchanger 52 can reduce a temperature difference between the liquid mixture having the intermediate temperature returned to the cooling section 7 and the cooling liquid to be produced in the cooling section 7. As a result, the thermal power required for the heating section 5 and the cooling section 7 can be reduced, so that power consumption in the heating section 5 and the cooling section 7 can be reduced.

Figure 3:
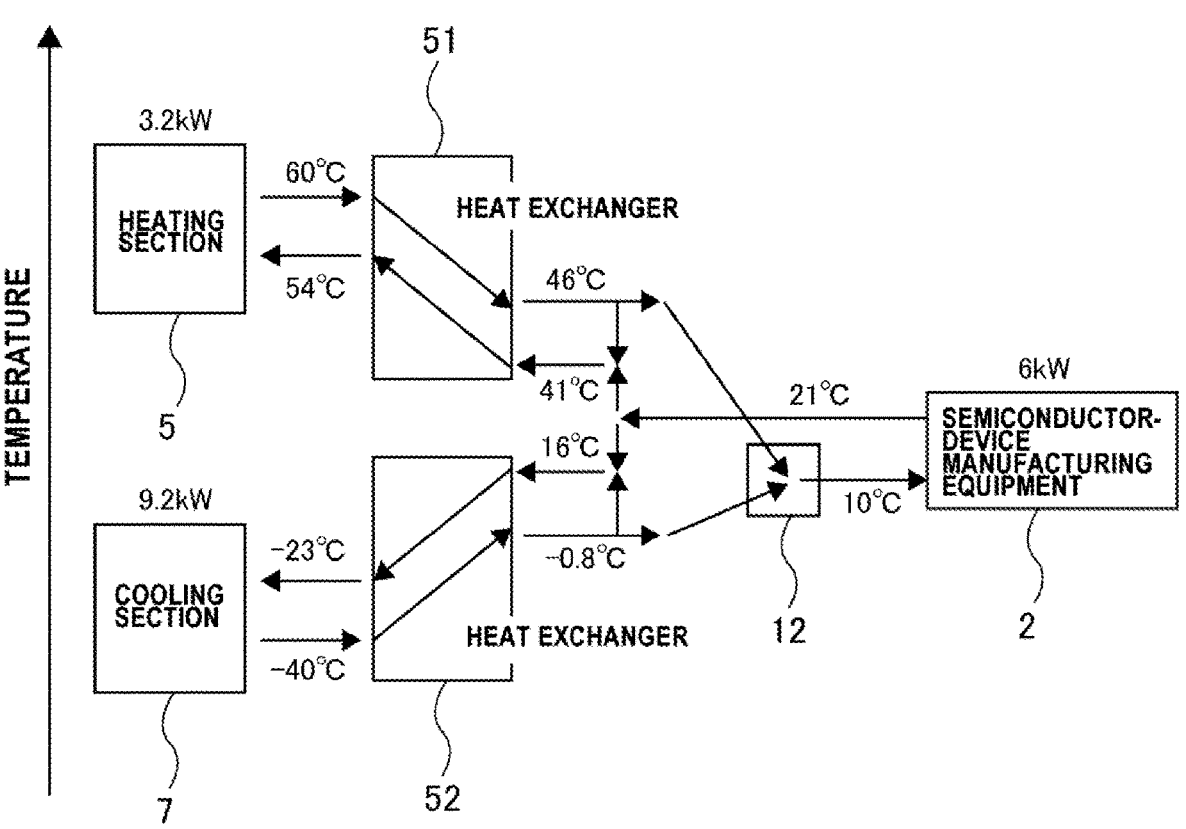
FIG. 3 is a graph showing an example of temperatures of a heating liquid, a cooling liquid, and a liquid mixture circulating between the temperature regulating apparatus and the semiconductor-device manufacturing equipment shown in FIG. 1.

FIG. 3 is a graph showing an example of temperatures of the heating liquid, the cooling liquid, and the liquid mixture circulating between the temperature regulating apparatus 1 and the semiconductor-device manufacturing equipment 2 shown in FIG. 1. In FIG. 3, vertical axis represents temperature. In this example, a temperature of the heating liquid produced in the heating section 5 is 60° C., a temperature of the cooling liquid produced in the cooling section 7 is –40° C., a temperature of the liquid mixture formed from the heating liquid and the cooling liquid to be supplied to the semiconductor-device manufacturing equipment 2 is 10° C., and a temperature of the liquid mixture that has passed through the semiconductor-device manufacturing equipment 2 is 21° C. A thermal load in the semiconductor-device manufacturing equipment 2 is 6 kW.

As shown in FIG. 3, a part of the liquid mixture returning from the semiconductor-device manufacturing equipment 2 has a temperature of 41° C. as a result of mixing of the liquid mixture having a temperature of 21° C. with the heating liquid having a temperature of 46° C. Furthermore, the liquid mixture is heated by the heating-side heat exchanger 51, so that the temperature of the liquid mixture increases from 41° C. to 54° C. Simultaneously, the other part of the liquid mixture returning from the semiconductor-device manufacturing equipment 2 has a temperature of 16° C. when the liquid mixture having a temperature of 21° C. is mixed with the cooling liquid having a temperature of –0.8° C. Furthermore, the liquid mixture is cooled by the cooling-side heat exchanger 52, so that the temperature of the liquid mixture is reduced from 16° C. to –23° C. As a result, the thermal power (heating load) of the heating section 5 is 3.2 kW and the thermal power (cooling load) of the cooling section 7 is 9.2 kW.

Figure 4:
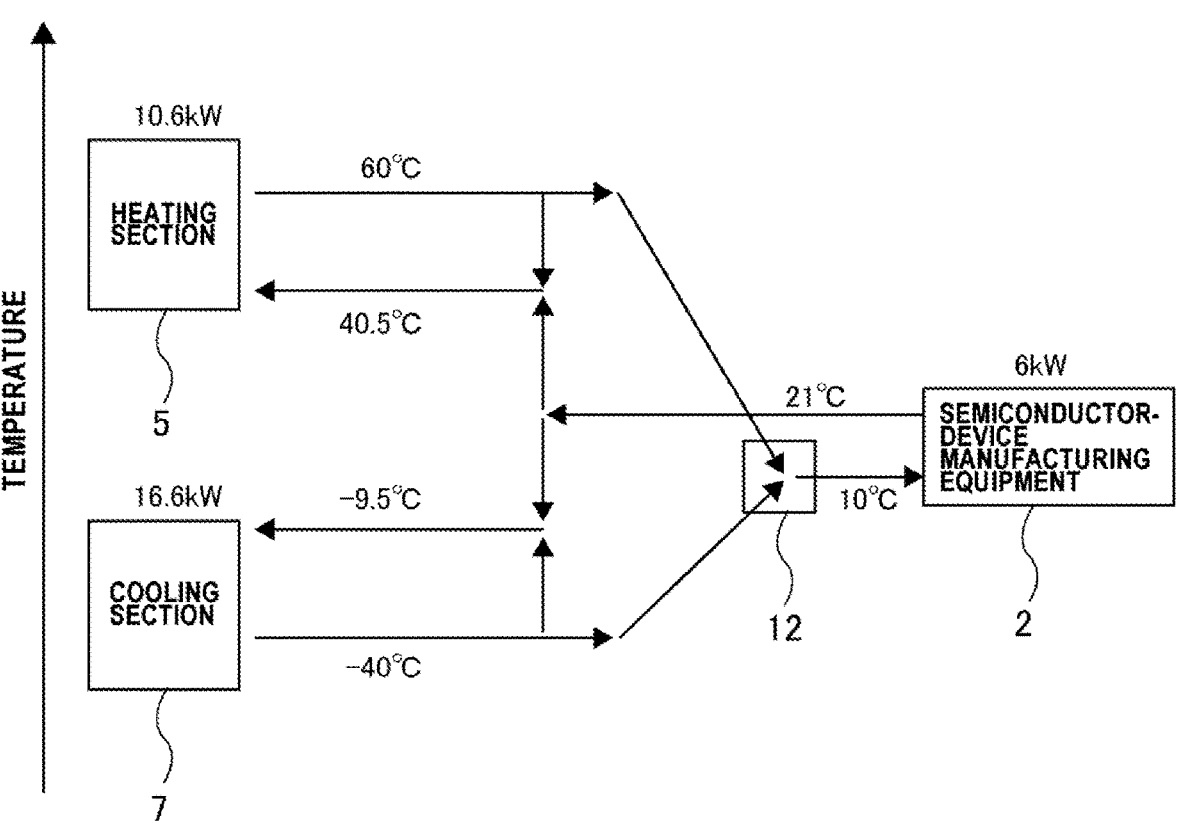
FIG. 4 is a graph showing an example of temperatures of the heating liquid, the cooling liquid, and the liquid mixture circulating between a temperature regulating apparatus with no heat exchanger and the semiconductor-device manufacturing equipment.

FIG. 4 is a graph showing an example of temperatures of the heating liquid, the cooling liquid, and the liquid mixture circulating between a temperature regulating apparatus 1 with no heat exchanger and the semiconductor-device manufacturing equipment 2. In this example also, the temperature of the heating liquid produced in the heating section 5 is 60° C., the temperature of the cooling liquid produced in the cooling section 7 is –40° C., the temperature of the liquid mixture formed from the heating liquid and the cooling liquid to be supplied to the semiconductor-device manufacturing equipment 2 is 10° C., and the temperature of the mixture that has passed through the semiconductor-device manufacturing equipment 2 is 21° C. The thermal load in the semiconductor-device manufacturing equipment 2 is 6 kW.

As shown in FIG. 4, a part of the liquid mixture with a temperature of 21° C. returning from the semiconductor-device manufacturing equipment 2 is mixed with the heating liquid having a temperature of 60° C., so that the liquid mixture having a temperature of 40.5° C. flows into the heating section 5. A difference between a temperature of 60° C. which is the set temperature of the heating liquid to be produced in the heating section 5 and the temperature of 40.5° C. of the liquid mixture is larger than the temperature difference in the example in FIG. 3. Therefore, the thermal power (heating load) of the heating section 5 is 10.6 kW. The other part of the liquid mixture with a temperature of 21° C.

returning from the semiconductor-device manufacturing equipment 2 is mixed with the cooling liquid having a temperature of –40° C., so that the liquid mixture having a temperature of –9.5° C. flows into the cooling section 7. A difference between a temperature of –40° C. which is the set temperature of the cooling liquid to be produced in cooling section 7 and the temperature of –9.5° C. of the liquid mixture is larger than the temperature difference in the example in FIG. 3. Therefore, the thermal power (cooling load) of the cooling section 7 is 16.6 kW.

As can be seen from a comparison between FIGS. 3 and 4, the heating-side heat exchanger 51 and the cooling-side heat exchanger 52 can reduce the thermal power in the heating section 5 and the cooling section 7. As a result, temperature regulation efficiency of the temperature regulating apparatus 1 can be improved.

Figure 5:
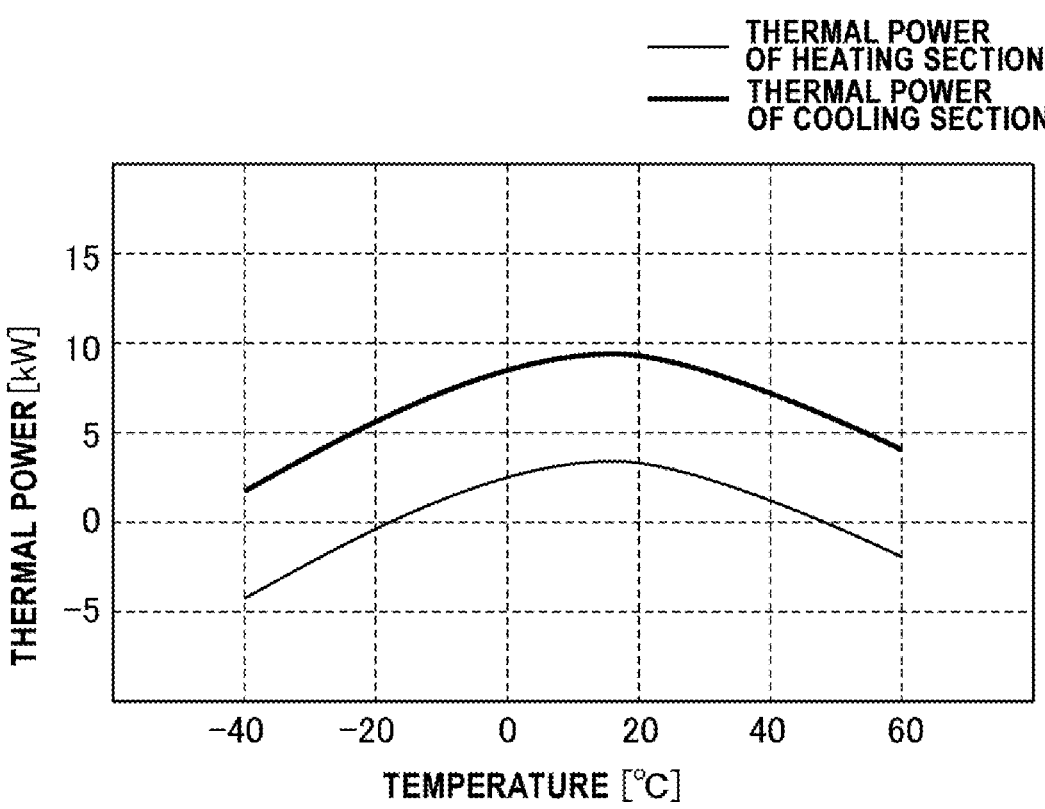
FIG. 5 is a graph showing a relationship between temperature [° C.] of the liquid mixture before flowing into the semiconductor-device manufacturing equipment and thermal power [kW] required for a heating section and a cooling section in the example shown in FIG. 3.
Figure 6:
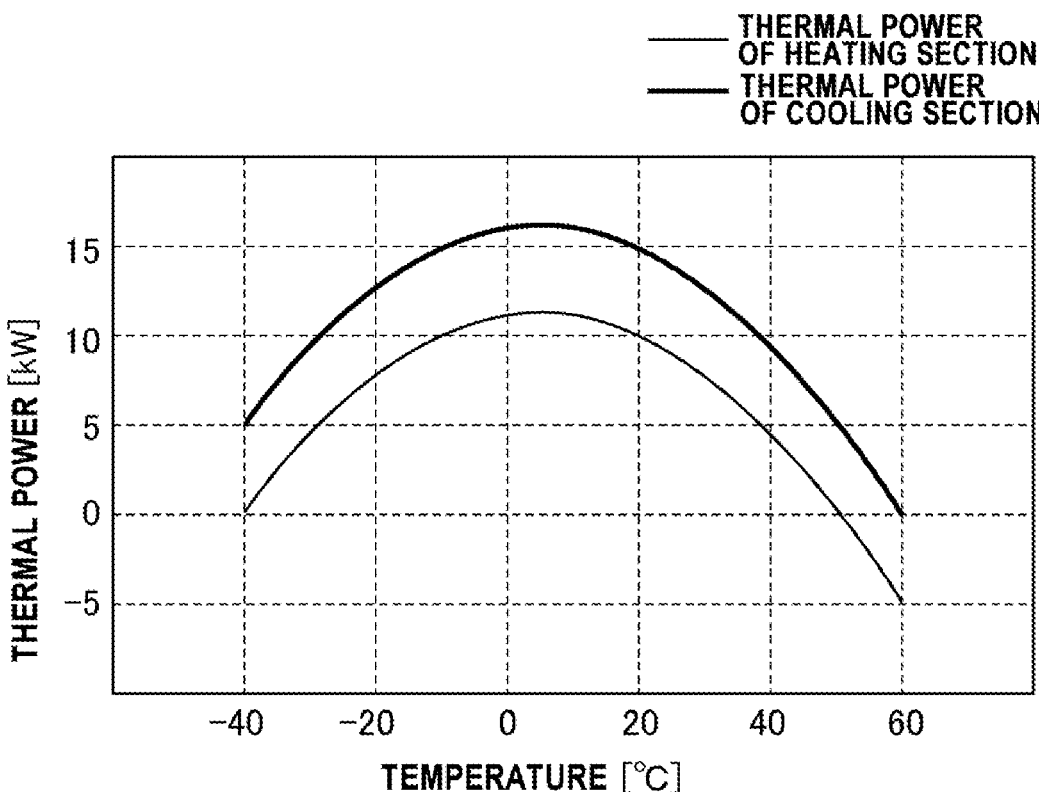
FIG. 6 is a graph showing a relationship between temperature [° C.] of the liquid mixture before flowing into the semiconductor-device manufacturing equipment and thermal power [kW] required for the heating section and the cooling section in the example shown in FIG. 4.

FIG. 5 is a graph showing a relationship between temperature [° C.] of the liquid mixture before flowing into the semiconductor-device manufacturing equipment 2 and thermal power [kW] required for the heating section 5 and the cooling section 7 in the example shown in FIG. 3. FIG. 6 is a graph showing a relationship between temperature [° C.] of the liquid mixture before flowing into the semiconductor-device manufacturing equipment 2 and thermal power [kW] required for the heating section 5 and the cooling section 7 in the example shown in FIG. 4.

In the graph shown in FIG. 5, when the temperature of the liquid mixture before flowing into the semiconductor-device manufacturing equipment 2 is 10° C., the thermal power (heating load) of the heating section 5 is 3.2 kW, and the thermal power (cooling load) of the cooling section 7 is 9.2 kW. In the graph shown in FIG. 6, when the temperature of the liquid mixture before flowing into the semiconductor-device manufacturing equipment 2 is 10° C., the thermal power (heating load) of the heating section 5 is 10.6 kW, and the thermal power (cooling load) of the cooling section 7 is 16.6 kW. As can be seen from this comparison, the heating-side heat exchanger 51 and the cooling-side heat exchanger 52 can significantly reduce the thermal power in the heating section 5 and the cooling section 7, particularly in an intermediate region between the temperature of the heating liquid and the temperature of the cooling liquid.

As shown in FIG. 5, when the temperature of the liquid mixture delivered to the semiconductor-device manufacturing equipment 2 is near the temperature (60° C.) of the heating liquid (i.e., when the target temperature of the semiconductor-device manufacturing equipment 2 is near the temperature of the heating liquid), the temperature of the liquid mixture returning from the semiconductor-device manufacturing equipment 2 to the heating section 5 is high, so that the thermal power of the heating section 5 is low (i.e., heating efficiency of the heating section 5 is high). Therefore, when the target temperature of the semiconductor-device manufacturing equipment 2 is fixed and is near the temperature of the heating liquid, the heating-side heat exchanger 51 may not be provided. Similarly, when the temperature of the liquid mixture delivered to the semiconductor-device manufacturing equipment 2 is near the temperature (–40° C.) of the cooling liquid (i.e., when the target temperature of the semiconductor-device manufacturing equipment 2 is near the temperature of the cooling liquid), the temperature of the liquid mixture returning from the semiconductor-device manufacturing equipment 2 to the cooling section 7 is low, so that the thermal power of the cooling section 7 is low (i.e., cooling efficiency of the cooling section 7 is high). Therefore, when the target temperature of the semiconductor-device manufacturing equipment 2 is fixed and is near the temperature of the cooling liquid, the cooling-side heat exchanger 52 may not be provided.

Figure 7:
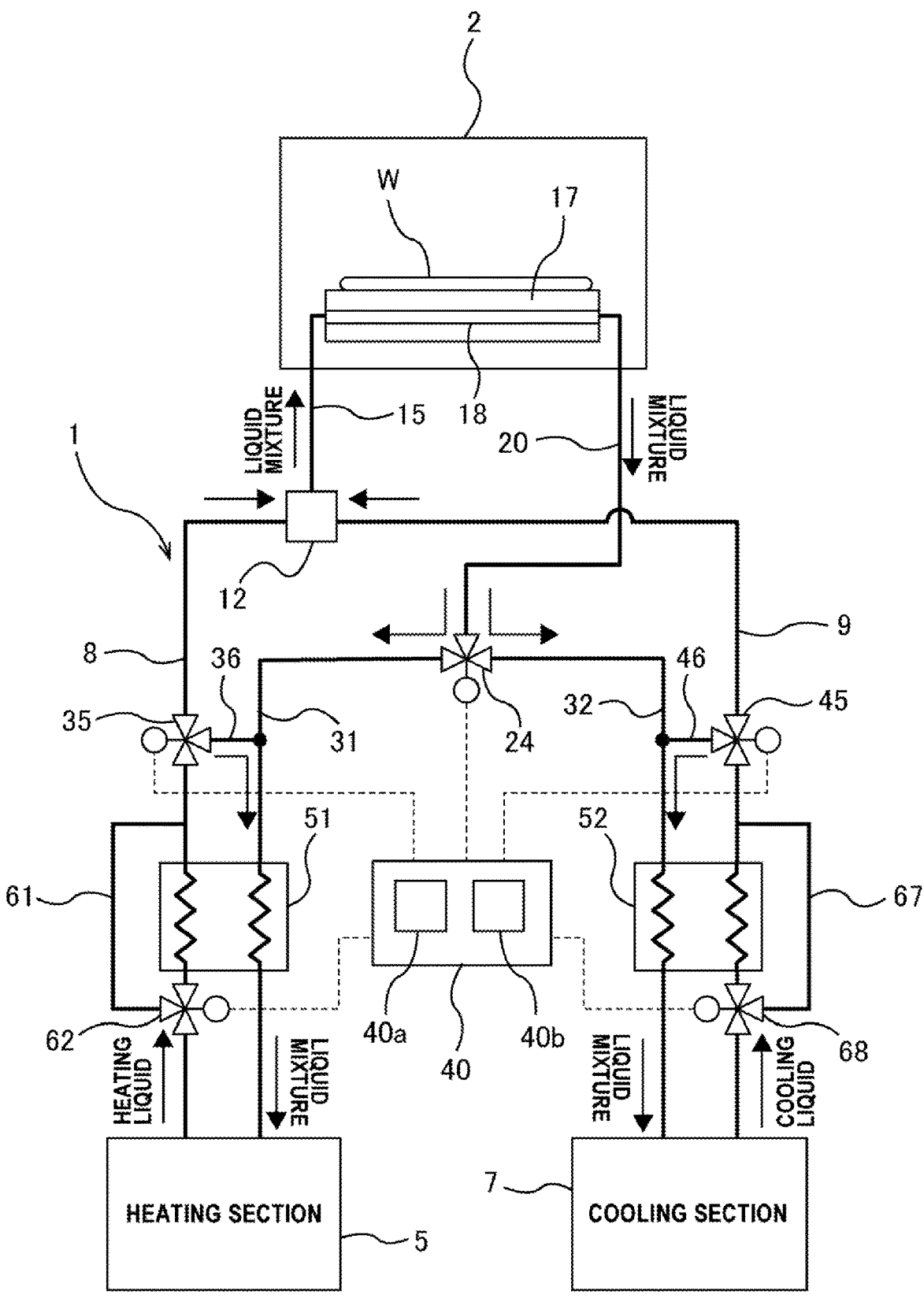
FIG. 7 is a schematic diagram showing another embodiment of the temperature regulating apparatus.
Figure 8:
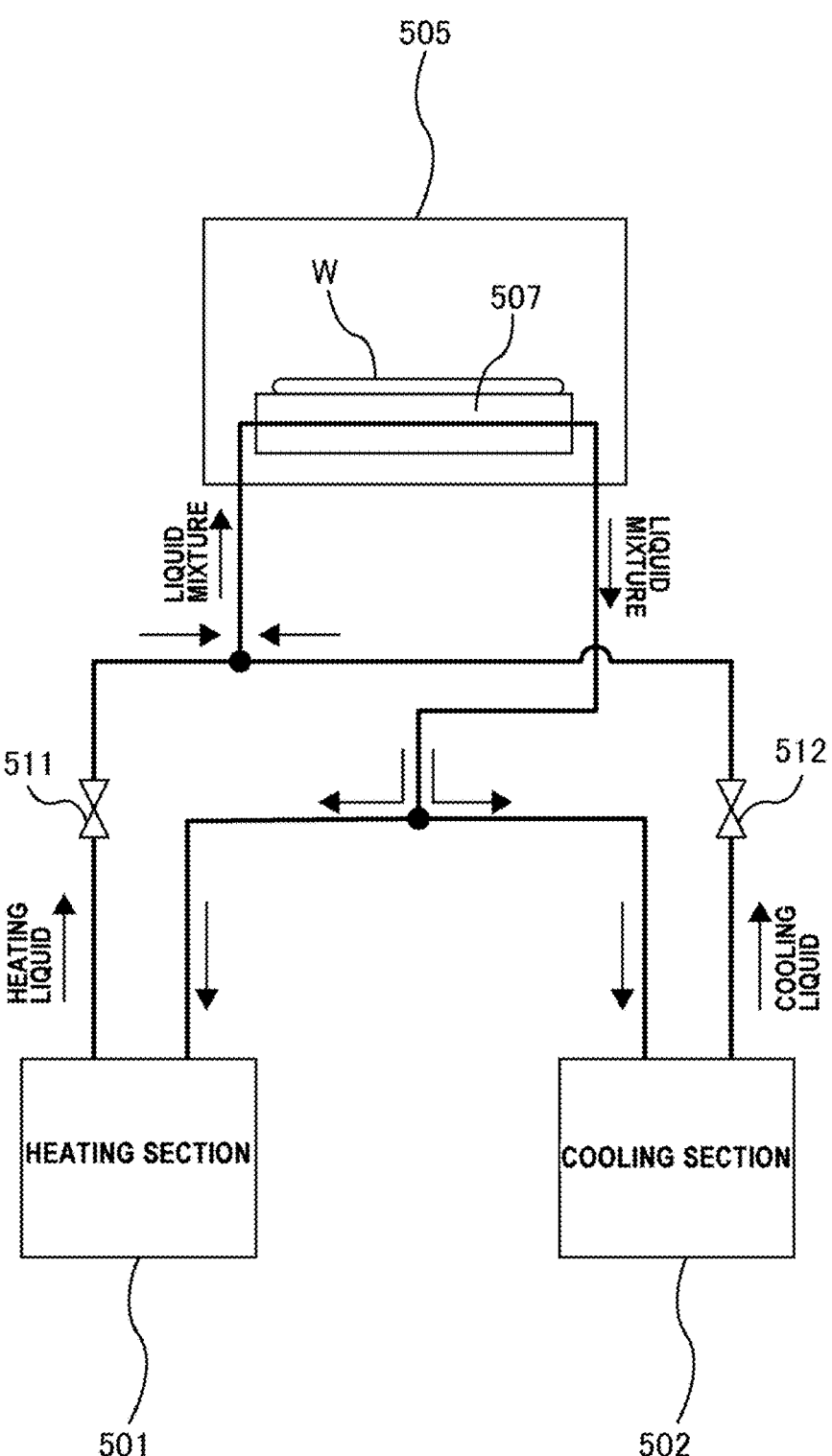
FIG. 8 is a schematic diagram showing an example of a conventional temperature regulating apparatus for semiconductor-device manufacturing equipment.

FIG. 7 is a schematic diagram of another embodiment of the temperature regulating apparatus 1. Configurations and operations of this embodiment, which will not be specifically described, are the same as those of the embodiments described with reference to FIGS. 1 to 6, and duplicated descriptions will be omitted.

The temperature regulating apparatus 1 of the embodiment shown in FIG. 7 further includes a heating-side bypass pipe 61 configured to bypass the heating-side heat exchanger 51, and a heating-side bypass valve 62 configured to regulate a flow rate of the heating liquid delivered to the heating-side bypass pipe 61 and a flow rate of the heating liquid delivered to the heating-side heat exchanger 51. The heating-side bypass pipe 61 is coupled to the heating-liquid delivery pipe 8. More specifically, one end of the heating-side bypass pipe 61 is coupled to the heating-liquid delivery pipe 8 at a position between the heating section 5 and the heating-side heat exchanger 51, and the other end of the heating-side bypass pipe 61 is coupled to the heating-liquid delivery pipe 8 at a position between the heating-side heat exchanger 51 and the heating-side flow-rate regulating valve 35.

The heating-side bypass valve 62 is disposed between the heating section 5 and the heating-side heat exchanger 51, and is coupled to both the heating-side bypass pipe 61 and the heating-liquid delivery pipe 8. Examples of the heating-side bypass valve 62 include a three-way valve, and a combination of multiple valves. The heating-side bypass valve 62 may be configured to selectively deliver the heating liquid produced by the heating section 5 to either the heating-side bypass pipe 61 or the heating-side heat exchanger 51. Alternatively, the heating-side bypass valve 62 may be configured to distribute the heating liquid produced by the heating section 5 to the heating-side bypass pipe 61 and the heating-side heat exchanger 51 with a certain flow-rate ratio.

The heating-side bypass valve 62 is electrically connected to the valve controller 40, and operations of the heating-side bypass valve 62 are controlled by the valve controller 40. More specifically, the valve controller 40 is configured to operate the heating-side bypass valve 62 based on a temperature index of the liquid mixture. This temperature index may be the target temperature set in the semiconductor-device manufacturing equipment 2, or may be a measured value of the temperature of the liquid mixture that has passed through the semiconductor-device manufacturing equipment 2. A temperature measuring device (e.g., temperature sensor) for obtaining the measured value of the temperature of the liquid mixture is attached to the outflow pipe 20 or the heating-side return pipe 31.

The valve controller 40 operates the heating-side bypass valve 62 to shut off the fluid communication between the heating section 5 and the heating-side bypass pipe 61 when the above-described temperature index is smaller than a heating-side threshold value. Thus, the heating liquid flows through the heating-side heat exchanger 51, but does not flow through the heating-side bypass pipe 61. When the above-described temperature index is above the heating-side threshold value, the valve controller 40 instructs the heating-side bypass valve 62 to provide the fluid communication between the heating section 5 and the heating-side bypass pipe 61. As a result, the heating liquid produced by the heating section 5 flows through the heating-side bypass pipe 61. The flow rate of the heating liquid flowing into the heating-side heat exchanger 51 decreases or becomes zero.

The heat exchange in the heating-side heat exchanger 51 increases the temperature of the liquid mixture, while this heat exchange lowers the temperature of the heating liquid. Therefore, when the target temperature set in the semiconductor-device manufacturing equipment 2 is near the temperature of the heating liquid, the heat exchange in the heating-side heat exchanger 51 may rather increase the thermal power required for the heating section 5. According to this embodiment, when the target temperature set in the semiconductor-device manufacturing equipment 2 is near the temperature of the heating liquid, at least part of the heating liquid bypasses the heating-side heat exchanger 51. Such operation can prevent a decrease in the temperature regulation efficiency of the temperature regulating apparatus 1.

The temperature regulating apparatus 1 of the embodiment shown in FIG. 7 further includes a cooling-side bypass pipe 67 configured to bypass the cooling-side heat exchanger 52, and a cooling-side bypass valve 68 configured to regulate a flow rate of the cooling liquid delivered to the cooling-side bypass pipe 67 and a flow rate of the cooling liquid delivered to the cooling-side heat exchanger 52. The cooling-side bypass pipe 67 is coupled to the cooling-liquid delivery pipe 9. More specifically, one end of the cooling-side bypass pipe 67 is coupled to the cooling-liquid delivery pipe 9 at a position between the cooling section 7 and the cooling-side heat exchanger 52, and the other end of the cooling-side bypass pipe 67 is coupled to the cooling-liquid delivery pipe 9 at a position between the cooling-side heat exchanger 52 and the cooling-side flow-rate regulating valve 45.

The cooling-side bypass valve 68 is disposed between the cooling section 7 and the cooling-side heat exchanger 52, and is coupled to both the cooling-side bypass pipe 67 and the cooling-liquid delivery pipe 9. Examples of the cooling-side bypass valve 68 include a three-way valve, and a combination of multiple valves. The cooling-side bypass valve 68 may be configured to selectively deliver the cooling liquid produced by the cooling section 7 to either the cooling-side bypass pipe 67 or the cooling-side heat exchanger 52.

Alternatively, the cooling-side bypass valve 68 may be configured to distribute the cooling liquid produced by the cooling section 7 to the cooling-side bypass pipe 67 and the cooling-side heat exchanger 52 with a certain flow-rate ratio.

The cooling-side bypass valve 68 is electrically connected to the valve controller 40, and operations of the cooling-side bypass valve 68 are controlled by the valve controller 40. More specifically, the valve controller 40 is configured to operate the cooling-side bypass valve 68 based on a temperature index of the liquid mixture. This temperature index may be the target temperature set in the semiconductor-device manufacturing equipment 2, or may be a measured value of the temperature of the liquid mixture that has passed through the semiconductor-device manufacturing equipment 2. A temperature measuring device (e.g., temperature sensor) for obtaining the measured value of the temperature of the liquid mixture is attached to the outflow pipe 20 or the cooling-side return pipe 32.

The valve controller 40 operates the cooling-side bypass valve 68 to shut off the fluid communication between the cooling section 7 and the cooling-side bypass pipe 67 when the above-described temperature index is larger than a cooling-side threshold value. Thus, the cooling liquid flows through the cooling-side heat exchanger 52, but does not flow through the cooling-side bypass pipe 67. When the above-described temperature index is below the cooling-side threshold value, the valve controller 40 instructs the cooling-side bypass valve 68 to provide the fluid communication between the cooling section 7 and the cooling-side bypass pipe 67. As a result, the cooling liquid produced by the cooling section 7 flows through the cooling-side bypass pipe 67. The flow rate of the cooling liquid flowing into the cooling-side heat exchanger 52 decreases or becomes zero.

The heat exchange in the cooling-side heat exchanger 52 lowers the temperature of the liquid mixture, while this heat exchange increases the temperature of the cooling liquid. Therefore, when the target temperature set in the semiconductor-device manufacturing equipment 2 is near the temperature of the cooling liquid, the heat exchange in the cooling-side heat exchanger 52 may rather increase the thermal power required for the cooling section 7. According to this embodiment, when the target temperature set in the semiconductor-device manufacturing equipment 2 is near the temperature of the cooling liquid, at least part of the cooling liquid bypasses the cooling-side heat exchanger 52. Such operation can prevent a decrease in the temperature regulation efficiency of the temperature regulating apparatus 1.

In this embodiment, when the target temperature of the semiconductor-device manufacturing equipment 2 is fixed and is near the temperature of the heating liquid, the heating-side heat exchanger 51, the heating-side bypass pipe 61, and the heating-side bypass valve 62 may not be provided. When the target temperature of the semiconductor-device manufacturing equipment 2 is fixed and is near the temperature of the cooling liquid, the cooling-side heat exchanger 52, the cooling-side bypass pipe 67, and the cooling-side bypass valve 68 may not be provided.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A temperature regulating apparatus for regulating a temperature of semiconductor-device manufacturing equipment, comprising:
   a heating section configured to produce a heating liquid;
   a cooling section configured to produce a cooling liquid;
   a heating-liquid delivery pipe coupled to the heating section, the heating-liquid delivery pipe being configured to deliver the heating liquid to the semiconductor-device manufacturing equipment;
   a cooling-liquid delivery pipe coupled to the cooling section, the cooling-liquid delivery pipe being configured to deliver the cooling liquid to the semiconductor-device manufacturing equipment;
   a heating-side return pipe coupled to the heating section, the heating-side return pipe being configured to return a liquid mixture of the heating liquid and the cooling liquid that have passed through the semiconductor-device manufacturing equipment to the heating section;
   a cooling-side return pipe coupled to the cooling section, the cooling-side return pipe being configured to return the liquid mixture that has passed through the semiconductor-device manufacturing equipment to the cooling section; and
   at least one of a heating-side heat exchanger arranged to preheat the liquid mixture before returning to the heating section with heat of the heating liquid by exchanging heat between the heating liquid flowing through the heating-liquid delivery pipe and the liquid mixture flowing through the heating-side return pipe, and a cooling-side heat exchanger arranged to precool the liquid mixture before returning to the cooling section with cold of the cooling liquid by exchanging heat between the cooling liquid flowing through the cooling-liquid delivery pipe and the liquid mixture flowing through the cooling-side return pipe.

2. The temperature regulating apparatus according to claim 1, further comprising:
   a heating-side flow-rate regulating valve attached to the heating-liquid delivery pipe; and
   a heating-side branch pipe extending from the heating-side flow-rate regulating valve to the heating-side return pipe.

3. The temperature regulating apparatus according to claim 1, further comprising:
   a cooling-side flow-rate regulating valve attached to the cooling-liquid delivery pipe; and
   a cooling-side branch pipe extending from the cooling-side flow-rate regulating valve to the cooling-side return pipe.

4. The temperature regulating apparatus according to claim 1, wherein
   the temperature regulating apparatus comprises the heating-side heat exchanger,
   the heating-side heat exchanger is coupled to the heating-liquid delivery pipe and the heating-side return pipe, and
   the temperature regulating apparatus further comprises:
      a heating-side bypass pipe coupled to the heating-liquid delivery pipe and configured to bypass the heating-side heat exchanger;
      a heating-side bypass valve configured to regulate a flow rate of the heating liquid delivered to the heating-side bypass pipe and a flow rate of the heating liquid delivered to the heating-side heat exchanger; and
      a valve controller configured to operate the heating-side bypass valve based on a temperature index of the liquid mixture.

5. The temperature regulating apparatus according to claim 4, wherein the temperature index comprises a temperature of the liquid mixture that has passed through the semiconductor-device manufacturing equipment.

6. The temperature regulating apparatus according to claim 4, wherein the temperature index comprises a target temperature set in the semiconductor-device manufacturing equipment.

7. The temperature regulating apparatus according to claim 4, wherein the valve controller is configured to instruct the heating-side bypass valve to provide a fluid communication between the heating section and the heating-side bypass pipe when the temperature index is above a heating-side threshold value.

8. A semiconductor-device manufacturing system comprising:
   semiconductor-device manufacturing equipment for manufacturing semiconductor devices; and
   the temperature regulating apparatus according to claim 4 for regulating a temperature of the semiconductor-device manufacturing equipment.

9. The temperature regulating apparatus according to claim 1, wherein the temperature regulating apparatus comprises the cooling-side heat exchanger, the cooling-side heat exchanger is coupled to the cooling-liquid delivery pipe and the cooling-side return pipe, and the temperature regulating apparatus further comprises:

a cooling-side bypass pipe coupled to the cooling-liquid delivery pipe and configured to bypass the cooling-side heat exchanger;

a cooling-side bypass valve configured to regulate a flow rate of the cooling liquid delivered to the cooling-side bypass pipe and a flow rate of the cooling liquid delivered to the cooling-side heat exchanger; and a valve controller configured to operate the cooling-side bypass valve based on a temperature index of the liquid mixture.

10. The temperature regulating apparatus according to claim 9, wherein the temperature index comprises a temperature of the liquid mixture that has passed through the semiconductor-device manufacturing equipment.

11. The temperature regulating apparatus according to claim 9, wherein the temperature index comprises a target temperature set in the semiconductor-device manufacturing equipment.

12. The temperature regulating apparatus according to claim 9, wherein the valve controller is configured to instruct the cooling-side bypass valve to provide a fluid communication between the cooling section and the cooling-side bypass pipe when the temperature index is below a cooling-side threshold value.

13. A semiconductor-device manufacturing system comprising:

semiconductor-device manufacturing equipment for manufacturing semiconductor devices; and the temperature regulating apparatus according to claim 9 for regulating a temperature of the semiconductor-device manufacturing equipment.

14. The temperature regulating apparatus according to claim 1, wherein the temperature regulating apparatus comprises both the heating-side heat exchanger and the cooling-side heat exchanger.

15. The temperature regulating apparatus according to claim 1, further comprising a liquid junction coupled to the heating-liquid delivery pipe and the cooling-liquid delivery pipe and configured to mix the heating liquid and the cooling liquid to produce the liquid mixture.

16. The temperature regulating apparatus according to claim 1, further comprising a distribution valve configured to distribute the liquid mixture that has passed through the semiconductor-device manufacturing equipment to the heating-side return pipe and the cooling-side return pipe.

17. A semiconductor-device manufacturing system comprising:

semiconductor-device manufacturing equipment for manufacturing semiconductor devices; and the temperature regulating apparatus according to claim 1 for regulating a temperature of the semiconductor-device manufacturing equipment.

\*   \*   \*   \*   \*